United States Patent [19]

Saito et al.

[11] 4,214,217
[45] Jul. 22, 1980

[54] ELECTRONIC TUNING CIRCUIT HAVING IMAGE TRAPPING ELEMENT

[75] Inventors: Mitsuo Saito; Sadahiko Yamashita, both of Kawasaki, Japan

[73] Assignee: Matsushita Electric Industrial Co., Ltd., Osaka, Japan

[21] Appl. No.: 12,216

[22] Filed: Feb. 14, 1979

[30] Foreign Application Priority Data

Feb. 15, 1978 [JP] Japan .................................. 53-17275

[51] Int. Cl.² ............................ H03J 3/00; H03J 5/00
[52] U.S. Cl. ........................................ 334/45; 334/41; 333/12
[58] Field of Search ....................... 334/41, 42, 45, 85; 333/230, 235, 203, 205, 207, 222, 223, 204, 238, 246, 12

[56] References Cited

U.S. PATENT DOCUMENTS 3,569,850  3/1971  Wegener et al. ....................... 334/45

Primary Examiner—Alfred E. Smith
Assistant Examiner—Thomas P. O'Hare
Attorney, Agent, or Firm—Lowe, King, Price & Becker

[57] ABSTRACT

A tuning circuit comprises a pair of identical resonant circuits each including a transmission line and a capacitive element, a coupling circuit associated with each transmission line to inject microwave energy into the resonant circuits and extract the tuned energy therefrom. An image trapping circuit is included which comprises a first section which intersects one of the transmission lines and connected to the coupling circuit associated with the intersected transmission line and a second section which extends from the point of connection of the first section with that coupling element to the opposite transmission line in a direction skewed relative to each transmission line. The second section of the image trap circuit provides a smooth interstage coupling between the two transmission lines over a range of resonant frequencies.

8 Claims, 7 Drawing Figures

4,214,217

ELECTRONIC TUNING CIRCUIT HAVING IMAGE TRAPPING ELEMENT

FIELD OF THE INVENTION

The present invention relates to tuning circuits for microwave frequencies, and in particular to such a tuning circuit having an image frequency trapping circuit capable of reducing the image interference ratio to an acceptable level over a substantial range of resonant frequency.

BACKGROUND OF THE INVENTION

An electronic tuning circuit of the prior art as disclosed in Japanese Patent Application 50-151489 (laid open to public inspection on July 23, 1977 as Publication No. 52-75153) includes an image trapping circuit which partially extends parallel with a pair of resonating transmission lines and partially extends at right angles crossing one of the transmission lines and coupled with a coupling element associated with the transmission line with which the trapping circuit crosses. The disclosed image trap provides an improvement of image interference ratio at a particular image frequency, but exhibits unsatisfactory value of ratio at other frequencies.

SUMMARY OF THE INVENTION

The present invention is an improvement over the disclosed prior art tuning circuit by the provision of another image trapping element connected to the prior art image trap. The image trap of the invention is an elongated segment which extends from the point of connection of the prior art image trap with a coupling circuit to a point adjacent to the other transmission line and is skewed relative to each transmission line, whereby the interstage coupling is rendered gradual over the substantial range of the resonant frequencies.

The present invention is based on the discovery that the coupling distance between the prior art image trap and one of the transmission lines is a determining factor of the trapping frequency of the tuning device as well as the resonant frequency. Otherwise stated, if the image coupling distance is suitably selected for a given resonant frequency, the trapping frequency can be adjusted to correspond to the image frequency. The skewed coupling element between the transmission lines provides the same effect as if the prior art image trap were automatically shifted with respect to the transmission line as a function of the resonant frequency.

An object of the invention is therefore to provide a tuning circuit which is capable of suppressing the image frequency to an acceptable level over a substantial range of resonant frequencies.

BRIEF DESCRIPTION OF THE DRAWINGS

The invention will be further described with reference to the accompanying drawings, in which.

DETAILED DESCRIPTION

Figure 1:
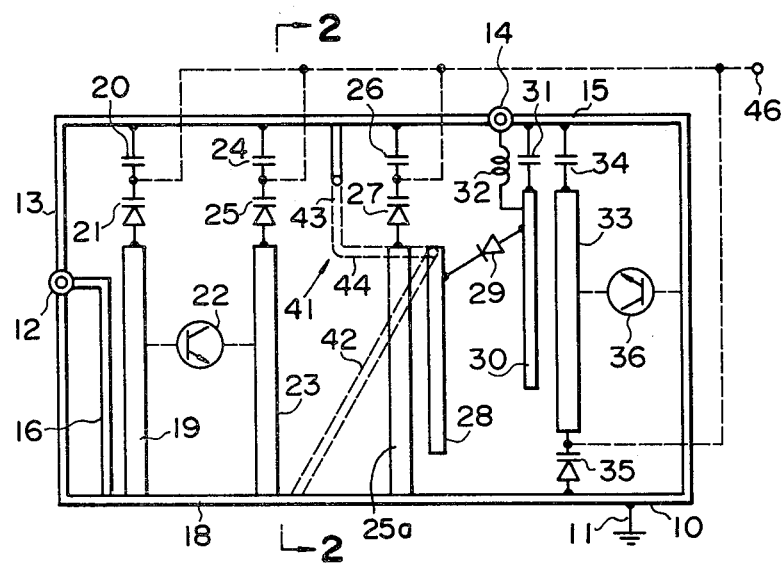
FIG. 1 is a plan view of an embodiment of the invention shown incorporated in an electronic tuning circuit.
Figure 2:
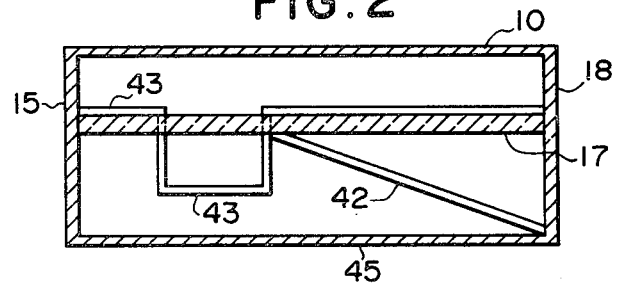
FIG. 2 is a cross-sectional view taken along the lines 2—2 of FIG. 1.

In FIG. 1, an electronic tuning device for ultra-high frequencies is shown as comprising a conductive housing 10 which is connected to a ground potential as at 11 and provided with an input terminal 12 on an end wall 13 and an output terminal 14 on a side wall 15 of the housing. A coupling circuit formed by a conductive film strip 16 is provided on a dielectric substrate 17 formed of glass epoxy, for example, which is suspended in the housing 10 as illustrated in FIG. 2, the film strip 16 being electrically connected at one end to the input terminal and at the other end to a side wall 18 which is at ground potential and extending parallel to the end wall 13. In parallel with the conductive strip film 16 and on the substrate 17 is disposed a conductive film strip 19 which is connected at one end to the side wall 18 to serve as an inductive element and connected at the other end to the side wall 15 through a capacitive element formed by a capacitor 20 and a voltage-controlled capacitor or varactor 21, whereby a quarter wave resonant circuit is formed across the side walls 15 and 18 to allow injection of microwave energy from the input terminal 12 through the coupling element 16 and through the inductive element 19 into the housing 10. The transmission line 19 is connected to the control electrode of a transistor 22 for amplification of the injected microwave energy and application of the amplified energy to a resonant circuit formed by a transmission line 23, capacitor 24 and varactor 25 connected in the same manner as the resonant circuit as described above.

Another quarter-wave resonant circuit is provided in parallel with the inductive element 23. An inductive strip element 25 is disposed on the substrate 17 and connected at one end with the side wall 18 and at the other end with a capacitive element comprising capacitor 26 and varactor 27. A coupling inductive element 28 runs parallel with the element 25 to transfer the resonant energy thereto.

The microwave energy tuned to the resonant frequency of the circuit formed by elements 23, 24, 25 is reactively coupled with the resonant circuit formed by elements 25, 26, 27, wherein the coupled energy is further tuned to the resonant frequency of the latter, so that the energy transferred to the coupling element 28 has a sharply defined passband characteristic with a center frequency tuned to the resonant frequency of the resonant circuits. It will be noted that the bandwidth of the tuning device is progressively reduced by the interstage coupling with a resultant increase in available energy at the center frequency.

The coupling element 28, connected by way of a mixer diode 29 to a coupling element 30, forms part of a local oscillator circuit together with a capacitor 31, a coil 32 in parallel therewith, and a half-wave resonant circuit formed by an inductive element 33, capacitor 34 and varactor 35, and a transistor 36. The locally generated microwave energy is coupled through the element 30 and mixed with the tuned microwave energy in the mixer diode 29. The mixer output at the intermediate frequency is withdrawn from the output terminal 14 through the coil 32.

In order to trap the image frequency component of the tuned energy, an image frequency trapping circuit is provided which comprises a first section 41 and a second section 42. The first section is formed by a first segment 43 extending parallel with the elements 23, 25, a part of which is disposed on the upper surface of the substrate 17 and another part of which is disposed underside of the substrate as shown in FIG. 2, and a second segment 44 which extends at right angles to the element 25 to the coupling element 28, intersecting the element 25.

Figure 4:
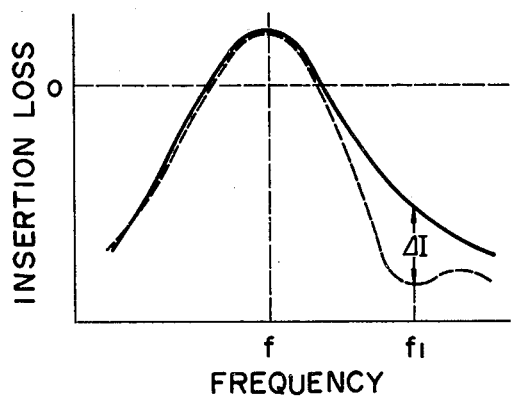
FIG. 4 is a graphic illustration of the trapping characteristic of a tuning device useful for describing the principle of the invention.

The image trapping element 41 has an effect of absorbing the microwave energy by 8 to 15 dB at the image frequency $f_{IF}$ (=120 MHz), so that the resultant image interference ratio is about 48 dB to 55 dB as shown in FIG. 4.

Figure 5:
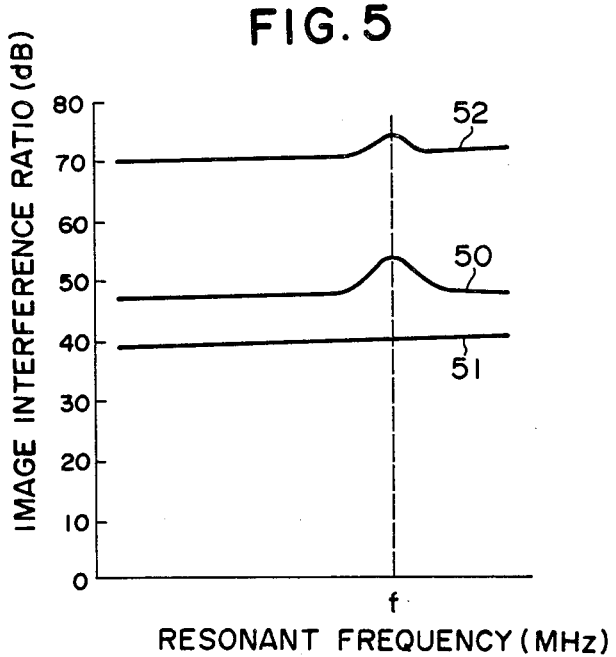
FIG. 5 is a plot of image interference ratio of the FIG. 1 embodiment in comparison with prior art tuning circuits.

The provision of such an image trapping element is not satisfactory for the following reason. In FIG. 5, the image interference ratio is plotted as a function of resonant frequency. Curve 50 indicates the characteristic of the tuning device having the image trapping element 41, while curve 51 indicates the characteristic of the device without the image trap 41. An acceptable level of improvement on the image interference ratio, however, is obtained only at the image frequency as indicated by curve 50.

Figure 6:
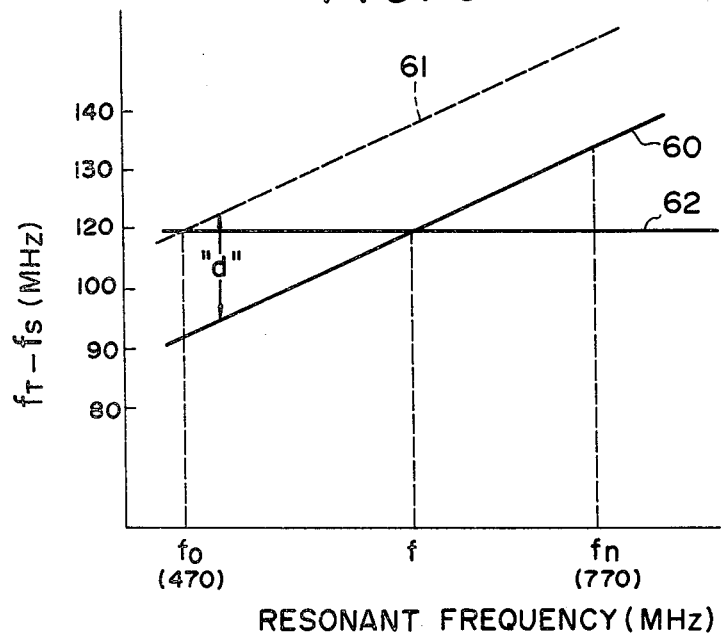
FIG. 6 is a graphic illustration of the operating characteristic of the invention in comparison with the prior art circuit.

Reference is further made to FIG. 6 for the explanation of the prior art disadvantage. FIG. 6 is a plot of difference between the trapping frequency $f_T$ and the resonant frequency $f_s$ as a function of the resonant frequency $f_s$, wherein the image frequency is set at a point corresponding to 120 MHz. As indicated by curve 60, the tuning device having only the image trap 41 exhibits a variation of trapping frequency as the resonant frequency changes, that is, the trapping frequency deviates from the image frequency as a function of the resonant frequency so that the trapping effect at the image requency of 120 MHz only occurs at a specific value of resonant frequency (f) and the trapping effect at a frequency $f_0$ (=470 MHz) occurs at the image frequency of 92 MHz.

It is found that the curve 60 can be shifted as a function of the distance between the image trap segment 43 and the transmission line 25 to a point as indicated by broken lines 61 which is obtained by making the coupling distance smaller than the distance with which curve 60 is obtained.

The present invention is thus based upon the fact that the trapping effect could occur at the desired image frequency regardless of resonant frequencies if the coupling distance between the image trapping circuit and the transmission line is varied as a function of the resonant frequency. Otherwise stated, when one desires that trapping occur at the image frequency (120 MHz) when the tuning device is tuned to a resonant frequency $f_0$, the coupling distance should be reduced by a distance "d".

The second section 42 of the image trapping circuit provides an advantageous effect which is analoguous to automatic variation of the aforesaid coupling distance as a function of resonant frequency. The second section 42 is formed of a conductive strip which extends from the point of connection of the first section 41 with the coupling element 28 to a point adjacent to the transmission line 23 at an angle to the transmission line 25, so that the effective coupling distance between the transmission lines 25 and 28 is gradually varied.

Figure 3:
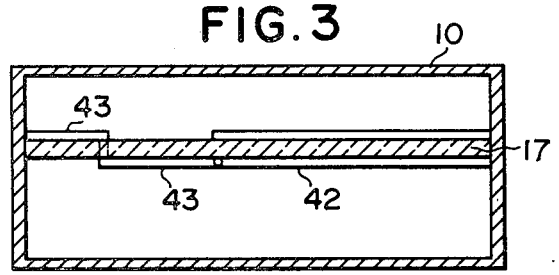
FIG. 3 is a modification of the embodiment of FIG. 1.

The section 42 of the image trap may extend at an angle to the plane of the substrate terminating at the bottom wall 45 of the housing as shown in FIG. 2, or may be disposed on the lower surface of the substrate as shown in FIG. 3. In the latter case, the first section 43 lies flat on opposite sides of the substrate.

The second trapping section 42 has the effect of causing the trapping frequency to always correspond to the image frequency of the tuning device although the resonant frequency changes over a substantial range, as indicated by a flat characteristic curve 62 in FIG. 6. The image interference ratio of the present invention is improved by 20 dB as indicated by curve 52 of FIG. 5.

In the embodiment of FIG. 1 the voltage control electrodes of the varactors 21, 25, 27 and 35 are connected to a DC control voltage source 46. In response to the control voltage the capacitance value of each resonant circuit is varied to shift the resonant frequency of the tuning device to a desired frequency.

Figure 7:
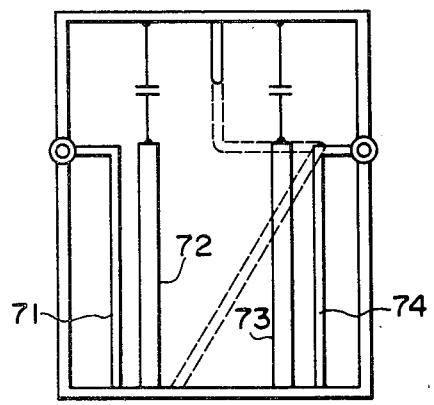
FIG. 7 is a plan view of another embodiment of the invention incorporated in a bandpass filter.

The concept of the present invention is also capable of application to a bandpass filter, one example of which is illustrated in FIG. 7.

This bandpass filter includes an input energy coupling element 71 reactively coupled with the transmission element 72 of a first resonant circuit and an output coupling element 74 reactively coupled with the transmission element 73 of the second resonant circuit. The image trapping element of the same construction as the embodiment of FIG. 1 is provided.

What is claimed is:

1. A tuning device comprising:
   a first resonant circuit including a transmission line and a coupling circuit reactively coupled therewith;
   a second resonant circuit including a transmission line and a coupling circuit reactively coupled therewith, the transmission lines of said first and second resonant circuits being parallel to each other; and
   an image frequency trapping circuit having a first section extending from a point intermediate said transmission lines to a point connected to the coupling circuit of said first resonant circuit intersecting the transmission line of said first resonant circuit, and a second section extending at an angle to said transmission lines from the connection point of said first section with said coupling circuit to a point adjacent to the transmission line of said second resonant circuit.

2. A tuning device as claimed in claim 1, wherein said first section of said image frequency trapping circuit comprises a first and a second linear segment, the first linear segment extending parallel with said transmission lines and said second linear segment extending at right angles to said transmission line of the first resonant circuit.

3. A tuning device as claimed in claim 2, further comprising a dielectric substrate having a first surface on which said transmission lines and said first linear segment are disposed and a second surface on which said second linear segment and said second section of the image frequency trapping circuit are disposed.

4. A tuning device as claimed in claim 3, wherein said second section of said image frequency trapping circuit extends at a first angle to said transmission lines and at a second angle to the plane of said substrate.

5. A tuning device as claimed in claim 1, wherein each of said resonant circuits includes a voltage-controlled capacitor connected in series with the associated transmission line.

6. A tuning device for ultra-high frequencies, comprising:
- a conductive housing of a box configuration;
- a dielectric substrate suspended within said housing to define first and second spaces of different volume with oppositely facing walls of said housing;
- a first resonant circuit having a conductive strip film on a first side of said substrate and in electrical contact at one end with one side wall of said housing and a voltage-controlled capacitor connected between the other end of said conductive strip film and another side wall of said housing opposite to said one side wall of said housing;
- a first coupling circuit including a conductive strip film on said substrate and reactively coupled with said conductive strip film of said first resonant circuit;
- a second resonant circuit having a conductive strip film on said first side of said substrate and in electrical contact at one end with said one side wall of said housing and a voltage-controlled capacitor connected between the other end of said conductive strip film and said another side wall of said housing;
- a second coupling circuit including a conductive strip film on said substrate and reactively coupled with said conductive strip film of said second resonant circuit;
- an image frequency trapping circuit having a first section comprised by an angled conductive strip connected at end to said another side wall and connected to the conductive strip film of said first coupling circuit at the other end intersecting said conductive strip film of said first resonant circuit, and a second section comprised by a conductive strip connected at one end to the other end of said conductive strip of the first section and connected at the other end to said one side wall of the housing, said conductive strip of said second section extending at an angle to said conductive films of said first and second resonant circuits.

7. A tuning device as claimed in claim 6, wherein said second section of said image frequency trapping circuit extends at an angle to the plane of said substrate.

8. A bandpass filter for ultra-high frequencies, comprising:
- a first resonant circuit including an inductive element and a capacitive element electrically connected between points of ground potentials;
- a second resonant circuit including an inductive element parallel with the inductive element of said first resonant circuit and a capacitor element electrically connected between points of ground potential;
- a first coupling circuit adjacent to said inductive element of said first resonant circuit;
- a second coupling circuit adjacent to said inductive element of said second resonant circuit; and
- an image frequency trapping circuit having a first section extending from a point intermediate said inductive elements to said first coupling circuit intersecting said inductive element of said first resonant circuit, and a second section extending at an angle from said first coupling circuit to a point adjacent to said inductive element of said second resonant circuit, said trapping circuit being electrically connected between points of ground potential.

* * * * *